(12) United States Patent
Park

(10) Patent No.: US 8,050,119 B2
(45) Date of Patent: Nov. 1, 2011

(54) DATA OUTPUT TIMING IN RESPONSE TO READ COMMAND BASED ON WHETHER DELAY LOCKED LOOP IS ENABLED/DISABLED IN A SEMICONDUCTOR DEVICE

(75) Inventor: Ki-Chon Park, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 336 days.

(21) Appl. No.: 12/165,097

(22) Filed: Jun. 30, 2008

(65) Prior Publication Data

US 2009/0168568 A1    Jul. 2, 2009

(30) Foreign Application Priority Data

Dec. 26, 2007   (KR) .................. 10-2007-0137431

(51) Int. Cl.
*G11C 7/00*   (2006.01)
(52) U.S. Cl. .............. 365/194; 365/230.08; 365/230.09; 365/233.11; 327/293; 327/294
(58) Field of Classification Search .................. 365/194, 365/230.08, 230.09, 233.1, 233.11; 327/291, 327/293, 294, 299, 145
See application file for complete search history.

(56) References Cited

U.S. PATENT DOCUMENTS

| | | | | |
|---|---|---|---|---|
| 7,542,358 B2* | 6/2009 | Jang | ............................... | 365/194 |
| 2001/0047464 A1* | 11/2001 | Shinozaki | ..................... | 711/167 |
| 2008/0008283 A1* | 1/2008 | Lee | ................................ | 375/375 |
| 2008/0056057 A1* | 3/2008 | Kim et al. | .................. | 365/233.1 |
| 2008/0079469 A1* | 4/2008 | Cho | ................................ | 327/158 |
| 2008/0157836 A1* | 7/2008 | Cho | ................................ | 327/158 |
| 2009/0116314 A1* | 5/2009 | Byun | ............................ | 365/194 |

FOREIGN PATENT DOCUMENTS

KR    1020010066128 A    7/2001

OTHER PUBLICATIONS

Notice of Preliminary Rejection issued from Korean Intellectual property Office on Dec. 22, 2008 with an English translation.

\* cited by examiner

*Primary Examiner* — Richard Elms
*Assistant Examiner* — Hien N Nguyen
(74) *Attorney, Agent, or Firm* — IP & T Group LLP

(57) ABSTRACT

A semiconductor memory device can output data according to a predetermined data output timing, in spite of a high frequency of system clock, even when a delay locked loop is disabled. The semiconductor memory device includes a delay locked loop configured to perform a delay locking operation on an internal clock to output delay locked clock, and a data output control unit configured to determine a data output timing, according to whether the delay locked loop is enabled or disabled, in response to a read command.

17 Claims, 5 Drawing Sheets

DATA OUTPUT TIMING IN RESPONSE TO READ COMMAND BASED ON WHETHER DELAY LOCKED LOOP IS ENABLED/DISABLED IN A SEMICONDUCTOR DEVICE

CROSS-REFERENCE TO RELATED APPLICATION

The present invention claims priority of Korean patent application number 10-2007-0137431, filed on Dec. 26, 2007, which is incorporated by reference in its entirety.

BACKGROUND OF THE INVENTION

The present invention relates to a semiconductor memory device, and more particularly to a data output control circuit for controlling a data output timing for outputting data in synchronization with a system clock in response to an external command input to the semiconductor memory device.

In a system with a variety of semiconductor devices, a semiconductor memory device serves as a data storage. The semiconductor memory device outputs data according to addresses received from a data processor, e.g., a central processing unit (CPU), or stores data received from the data processor into memory cells selected by the addresses.

As the operating speed of the system increases and semiconductor integrated circuit technologies are advanced, semiconductor memory devices are required to input and output data at higher speed. More particularly, a synchronous semiconductor memory device has been developed which may input/output data in synchronization with an input system clock in order to input/output the data at high speed. However, since the synchronous semiconductor memory device was not enough to satisfy a required data input/output speed, a double data rate (DDR) synchronous semiconductor memory device has been developed which inputs/outputs data in synchronization with a rising edge and a falling edge of a system clock, respectively.

Since the DDR synchronous semiconductor memory device inputs/outputs data at both the rising edge and falling edge of the system clock, it must process two data during one cycle of the system clock. That is, the DDR synchronous semiconductor memory device must output stored data at the rising edge or falling edge of the system clock, and receive and store data at the rising edge or falling edge of the system clock. Specifically, a data output timing of the DDR synchronous semiconductor memory device must be exactly synchronized with the rising edge or falling edge of the system clock. To this end, DDR synchronous semiconductor memory device is provided with a data output circuit for outputting data at the rising edge and falling edge of the input system clock.

The semiconductor memory device must output data in response to a read command when a predetermined cycles of the system clock pass by after the corresponding read command is input thereto. A column address strobe (CAS) latency (CL) determines a start timing of data output. Generally, the semiconductor memory device supports a plurality of CAS latencies, which may be adjusted according to operation environment. The CAS latency is set in a mode register set (MRS) of the semiconductor memory device. When the external read command is input, the semiconductor memory device determines a data output timing according to the CAS latency set in the MRS.

The system clock input to the semiconductor memory device is delayed by a clock input buffer, which buffers the system clock to output an internal clock, and a transmission line for transferring the internal clock signal. The delayed system clock is then transferred to the data output circuit. If data are output in synchronization with the delayed system clock, an external device will receive data which are not synchronized with the rising edge and falling edge of the system clock. To solve this problem, the semiconductor memory device includes a delay locked loop (DLL) for locking a delay of a clock signal. The DLL is a circuit for compensating the system clock for a delay value that is caused by an internal circuit of the semiconductor memory device until the system clock is input to the semiconductor memory device and thereafter is transferred to the data output circuit.

In order to output data in response to an external command exactly after the CAS latency, the semiconductor memory device includes a data output control circuit which determines a data output timing using a delay locked clock output from the delay locked loop and the CAS latency set in the MRS. If the delay locked clock with a locked phase is output and then its phase is not changed anymore in spite of a change of an operation mode or environment of the semiconductor memory device, the delay locked loop stops a delay-locking operation for reducing power consumption. In this case, the data output control circuit, however, may continuously output data using the delay locked clock with a locked phase.

FIG. 1 is a block diagram of a conventional semiconductor memory device. The semiconductor memory device outputs data in synchronization with a delay locked clock output from the delay locked loop or outputs data in synchronization with the external system clock when the delay locked loop does not perform the delay-locking operation.

Referring to FIG. 1, the semiconductor memory device includes a command decoder 110, a clock buffer 120, a delay locked loop (DLL) 130, an output signal generator 150, an output delay 170, and an output timing determiner 190. When the command decoder 110 receives and decodes an external command CMD and then recognizes the external command as a read command RDCMD, it outputs the read command RDCMD to the output signal generator 150. External system clocks CK and CKB are buffered by the clock buffer 120 and are transferred to the output signal generator 150 as an internal clock ICLK.

The output signal generator 150 receiving the internal clock ICLK generates an output enable signal OE having information on a burst length (BL) in response to the read command RDCMD. The delay locked loop 130 outputs a delay locked clock DLLCLK to the output delay 170 in response to the internal clock ICLK. The delay locked clock DLLCLK is generated after delay locking of the external system clocks CK and CKB by compensating a value delayed by an internal circuit of the semiconductor memory device until the external system clocks CK and CKB are input to the semiconductor memory device and are transferred to a data output circuit. When a DLL stop signal DLLOFF is activated, the delay locked loop 130 stops the delay-locking operation and passes the internal clock ICLK. The output delay 170 compensates a phase difference between the external system clock CK and the delay locked clock DLLCLK, and is commonly similar to a replica delay circuit for feedback included in the delay locked loop. Furthermore, the output delay 170 models a delay value of the external system clock CK delayed in the semiconductor memory device, and outputs a delayed delay-locked clock ECLK obtained by delaying the delay locked clock DLLCLK to the output timing determiner 190.

The output timing determiner 190 receives the output enable signal OE and the delayed delay-locked clock ECLK to output a data output control signal OUTEN corresponded to the CAS latency. More specifically, during an activation section of the output enable signal OE corresponded to the burst length (BL), the output timing determiner 190 shifts a phase of the delayed delay-locked clock ECLK according to the CAS latency to thereby generate the data output control signal OUTEN.

FIG. 2 a signal timing diagram illustrating the operation of the semiconductor memory device of FIG. 1 when the delay locked loop 130 is enabled.

Referring to FIG. 2, the DLL stop signal DLLOFF is deactivated to a logic low level, and the delay locked loop 130 performs the delay locking operation to output the delay locked clock DLLCLK. The delay locked clock DLLCLK is output by compensating a delay amount of the system clock CK in the semiconductor memory device, and a phase of the delay locked clock DLLCLK leads a phase of the corresponding system clock CK by a compensation time tAC. The output delay 170 delays the delay locked clock DLLCLK by a delay amount tDLL of the replica circuit to output the delayed delay-locked clock ECLK. The output enable signal OE output from the output signal generator 150 is activated in synchronization with the rising edge of the system clock CK in response to the read command RDCMD. At this point, an output signal generation time tOE extends from the rising edge of the system clock CK to an activation of the output enable signal OE.

When the rising edge of the delayed delay-locked clock ECLK occurs after an activation of the output enable signal OE, the output timing determiner 190 can output the data output control signal OUTEN at a desired time. That is, the output timing determiner 190 of the semiconductor memory device can have an operation margin tS shown in FIG. 2.

FIG. 3A is a signal timing diagram illustrating the operation of the semiconductor memory device shown in FIG. 1 in a low frequency operation environment when the delay locked loop is disabled. FIG. 3B is a signal timing diagram illustrating the operation of the semiconductor memory device shown in FIG. 1 in a high frequency operation environment when the delay locked loop is disabled.

Referring to FIG. 3A, when the DLL stop signal DLLOFF is activated to a logic high level, the delay locked loop 130 passes the internal clock ICLK without performing the delay-locking operation, to output the delay locked clock DLLCLK. Therefore, the delay locked clock DLLCLK is delayed by a pass time tICK from the rising edge of the system clock CK. At this point, the delay locked clock DLLCLK is delayed through the output delay 170 by a delay amount tDLL of the replica circuit, as described above with reference to FIG. 2.

In response to the read command RDCMD, the output signal generator 150 generates the output enable signal OE after the output signal generation time tOE elapses from the system clock CK (described by an arrow) corresponding to the read command RDCMD. Accordingly, the output time determiner 190 of the semiconductor memory device can have an operation margin tS shown in FIG. 3A.

Referring to FIG. 3B, similar to FIG. 3A, since the DLL stop signal DLLOFF is activated to a logic high level, the delay locked loop 130 outputs the delay locked clock DLLCLK which is delayed by a pass time tICK from the rising edge of the system clock CK. The output delay 170 delays the delay locked clock DLLCLK by a delay amount tDLL of the replica circuit to output the delayed delay-locked clock ECLK, as described above with reference to FIG. 2.

The output signal generator 150 generates the output enable signal OE after the output signal generation time tOE according to the read command RDCMD. In this case, the delayed delay-locked clock ECLK, which has the same period as the system clock CK and frequency higher than that of FIG. 3A, has twice the rising edges during a time corresponding to the delay amount tDLL of the replica circuit. Accordingly, the output timing determiner 190 of the semiconductor memory device recognizes a rising edge prior to the rising edge of the delayed delay-locked clock ECLK which is delayed as much time as the delay amount tDLL of the replica circuit, and outputs the data output control signal OUTEN after shifting a phase of the delayed delay-locked clock ECLK according to the CAS latency. In this case, malfunction may occur in the semiconductor memory device because a data output timing according to the data output control signal OUTEN becomes faster than a desired timing by one period 1tCK of the system clock CK.

In a high frequency operation environment, if tOE<tICK+tDLL−1tCK (where tOE is the output signal generation time tOE, tICK is the pass time tICK, tDLL is the delay amount of the replica circuit, and 1tCK is the period of the system clock CK), the data output timing become faster by the one period 1tCK of the system clock than the desired timing.

As described above, since the delay amount tDLL of the replica circuit of the output delay 170 has a constant value irrespective of a frequency of the system clock CK, the output timing of data, which are output after the read operation, is not adjusted according to the CAS latency when the semiconductor memory device operates in accordance with the system clock CK having a high frequency. In FIG. 3B, it has been described that the data are output according to a value of CL-1, which is one less than the CAS latency, instead of the CAS latency. However, when the system clock CK has higher frequency than in of FIG. 3, the data can be output according to a value of CL-2 or a value of CL-3, which is less than a value of CL-1. Ultimately, in an operation state where the delay locked loop 130 of the semiconductor memory device does not perform the delay locking operation, the data corresponded to the read command RDCMD may not be output according to the CAS latency.

Referring to FIGS. 3A and 3B, when tOE=tICK+tDLL−1tCK, the data are output according to the CAS latency or the value of CL-1, depending on operation environments (for example, process, voltage, and temperature) of the semiconductor memory device. Therefore, the operation reliability of the semiconductor memory device is greatly degraded.

Consequently, a frequency of the delay locked clock increases according to a high frequency of the system clock of the semiconductor memory device. On the other hand, when a delay amount of the output delay, which includes a replica delay element for compensating the delay locked clock for a delay amount delayed in the semiconductor memory device, is maintained to be same, the change of the data output timing may occur in the conventional semiconductor memory device which counts the rising edge of the system clock and the rising edge of the delay locked clock to determine the data output timing. Therefore, the conventional semiconductor memory device has difficulty in performing a high frequency operation.

SUMMARY OF THE INVENTION

Embodiments of the present invention are directed to providing a semiconductor memory device which can output data according to a predetermined data output timing, in spite of a high frequency of system clock, even when a delay locked loop is disabled.

In accordance with an aspect of the invention, there is provided a semiconductor memory device, which includes a delay locked loop configured to perform a delay locking operation on an internal clock to output delay locked clock, and a data output control unit configured to determine a data output timing, according to whether the delay locked loop is enabled or disabled, in response to a read command.

In accordance with another aspect of the invention, there is provided a semiconductor memory device, which includes an output signal generator configured to generate an output enable signal in response to a read command, an operation controller configured to differently control a delay amount reflected on a delay locked clock output from a delay locked loop according to whether the delay locked loop is enabled or disabled, and an output timing determiner configured to determine a data output timing according to a CAS latency in response to the output enable signal and an output of the operation controller.

In accordance with further aspect of the present invention, there is provided a method for operating a semiconductor memory device, the method including generating an output enable signal according to a read command, and determining a data output timing according to a CAS latency in response to the read command by using the output enable signals and a delay locked clock, whose phase is controlled according to whether a delay locking operation is performed or not.

The invention can overcome an frequency limitation of an usable system clock by allowing the data output control circuit for controlling an output timing of data corresponding to an external read command to compensate a delay in a transfer process of the system clock, thereby outputting the data according to the predetermined output timing of the data even when a delay locked loop is disabled. To this end, the data output control circuit calculates the output timing of the data without compensating a delay occurring in the transfer process of the system clock when the delay locked loop is disabled, and it calculates the output timing of the data by compensating the delay of the system clock when the delay locked loop is activated. Accordingly, the invention can satisfy the predetermined output timing of the data whether the delay locked loop of the semiconductor memory device is enabled or not in spite of a high frequency environment.

DESCRIPTION OF SPECIFIC EMBODIMENTS

Hereinafter, a semiconductor memory device in accordance with the present invention will be described in detail with reference to the accompanying drawings.

Figure 1:
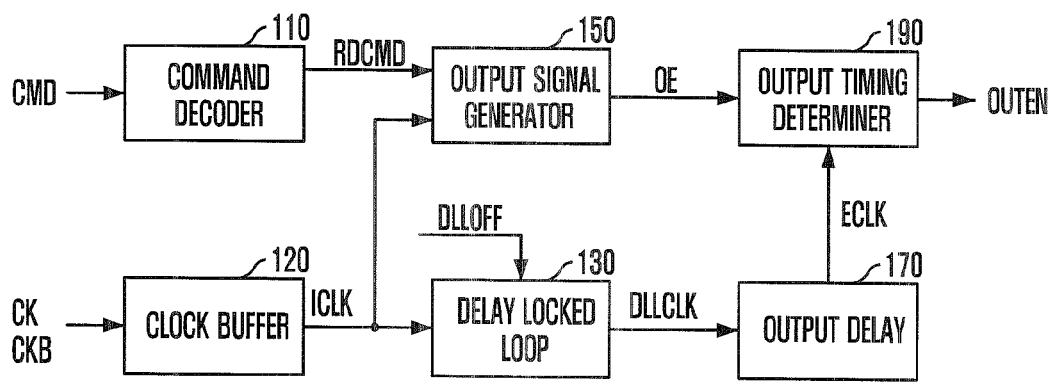
FIG. 1 is a block diagram of a conventional semiconductor memory device.
Figure 2:
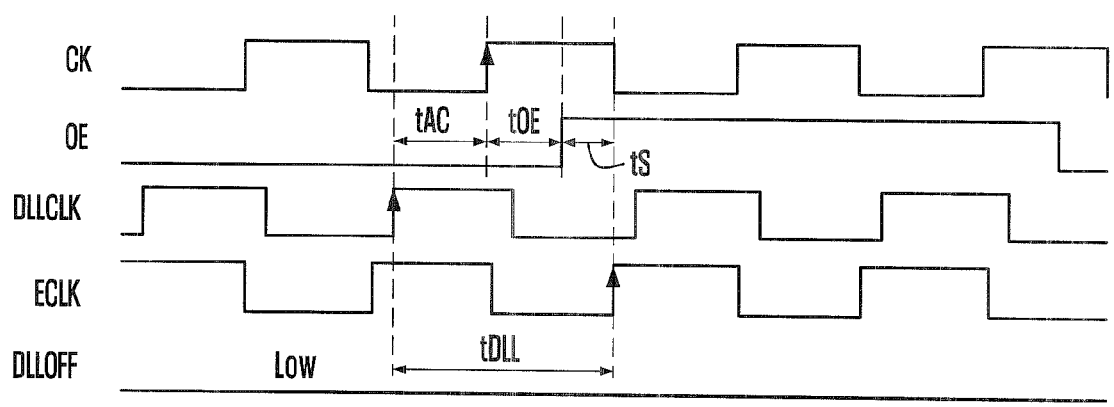
FIG. 2 a signal timing diagram illustrating an operation of the semiconductor memory device of FIG. 1 when a delay locked loop of FIG. 1 is enabled.
Figure 3A:
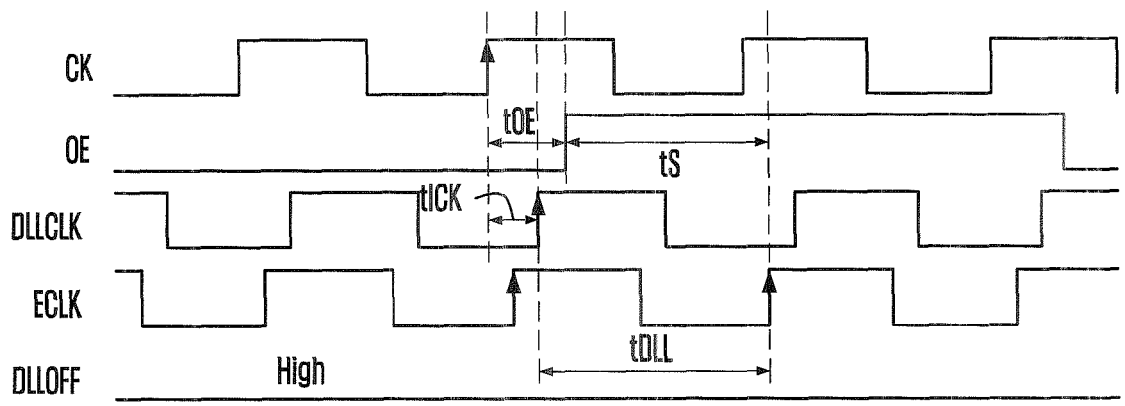
FIG. 3A is a signal timing diagram illustrating the operation of the semiconductor memory device of FIG. 1 in a low frequency operation environment when the delay locked loop is disabled.
Figure 3B:
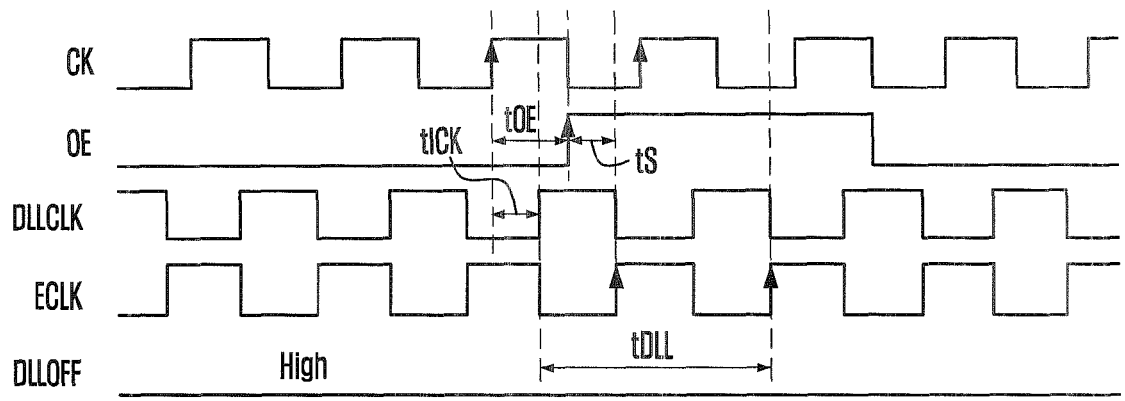
FIG. 3B is a signal timing diagram illustrating the operation of the semiconductor memory device of FIG. 1 in a high frequency operation environment when the delay locked loop is disabled.
Figure 4:
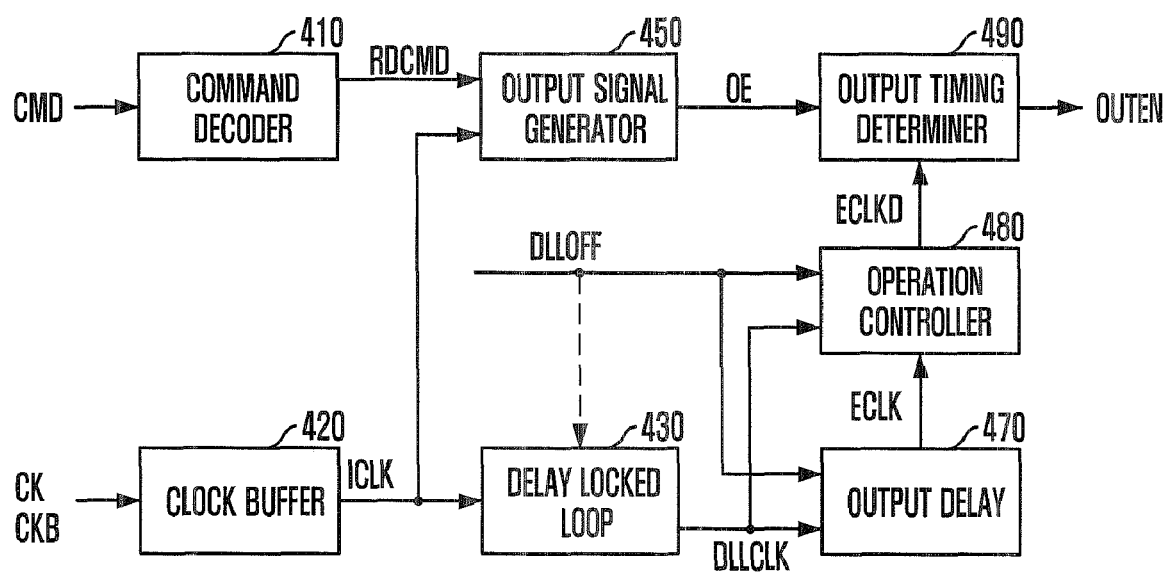
FIG. 4 is a block diagram of a semiconductor memory device in accordance with an embodiment of the present invention.

FIG. 4 is a block diagram of a semiconductor memory device in accordance with an embodiment of the invention.

Referring to FIG. 4, the semiconductor memory device compensates a delay amount of a system clock in a transfer path when a delay locked loop 430 is enabled, but it determines a data output timing in response to a read command RDCMD by using a delay locked clock DLLCLK, where a delay amount is not compensated, when the delay locked loop 430 is disabled.

More specifically, the semiconductor memory device includes an output signal generator 450 configured to generate an output enable signal OE according to the read command RDCMD, an operation controller 480 configured to differently control a delay amount reflected on the delay locked clock DLLCLK depending on whether the delay locked loop 430 is enabled or disabled, and an output timing determiner 490 configured to receive the output enable signal OE and an output ECLKD of the operation controller 480 to determine the data output timing according to a CAS latency (CL). A delay locked loop 430 is further provided to be enabled according to an operation mode of the semiconductor memory device and compensate a delay amount of the system clock in an internal clock path, thereby generating the delay locked clock DLLCLK used as a reference of an internal operation. Furthermore, the delay locked loop 430 outputs the delay locked clock DLLCLK to an output delay 470 and the operation controller 480. However, when a DLL stop signal DLLOFF is activated, the delay locked loop 430 stops a delay locking operation on an input internal clock ICLK and outputs the delay locked clock DLLCLK through an internal path.

The semiconductor memory device further includes a clock buffer 420, a command decoder 410, and the output delay 470. The clock buffer 420 buffers external system clocks CK and CKB to transfer the internal clock ICLK to the delay locked loop 430 and the output signal generator 450. The command decoder 410 decodes an external command CMD to recognize the decoded external command CMD as the read command RDCMD, and notifies the generation of the read command RDCMD to the output signal generator 450. The output delay 470 delays the delay locked clock DLLCLK, which is output from the delay locked loop 430, by a first delay amount (i.e., a delay amount tDLL of a replica circuit) delayed in the transfer path of the system clock, and transfers it to the operation controller 480.

As illustrated in FIG. 4, the semiconductor memory device further includes the operation controller 480, as opposed to the conventional semiconductor memory device. Hereinafter, the operation of the semiconductor memory device in accordance with the embodiment of the invention will be described below in detail.

The command decoder 410 decodes the external command CMD to recognize the decoded external command CMD as the read command RDCMD, and notifies the generation of the read command RDCMD to the output signal generator 450. Moreover, the clock buffer 420 buffers the external system clocks CK and CKB to generate the internal clock ICLK, and it transfers the internal clock ICLK to the delay locked loop 430 and the output signal generator 450.

The DLL stop signal DLLOFF is input to the output delay 470 and the operation controller 480, as well as the delay locked loop 430. When the DLL stop signal DLLOFF is deactivated, the output delay 470 delays the delay locked clock DLLCLK by the first delay amount and outputs a delayed delay-locked clock ECLK. The operation controller 480 receiving the delayed delay-locked clock ECLK buffers the delayed delay-locked clock ECLK. The buffered delay-locked clock ECLKD is output to the output timing determiner 490.

On the other hand, when the delay locked loop 430 does not perform the delay locking operation due to the activation of the DLL stop signal DLLOFF, the output delay 470 receives the delay locked clock DLLCLK input from the delay locked loop 430 to output a deactivation signal with a logic low level. At this point, the operation controller 480 delays the delay locked clock DLLCLK output from the delay locked loop 430 by a second delay amount (i.e., an internal delay time tICK), instead of the deactivation signal output from the output delay 470, thereby outputting the buffered delay-locked clock ECLKD to the output timing determiner 490.

The output timing determiner 490 receives the output enable signal OE and the buffered delay-locked clock ECLKD to output a data output control signal OUTEN corresponding to the CAS latency. In more detail, during an activation section of the output enable signal OE corresponding to the burst length (BL), the output timing determiner 490 shifts a phase of the buffered delay-locked clock ECLKD according to the CAS latency to thereby generate the data output control signal OUTEN.

To solve disadvantages of the related art, the invention delays the delay locked clock DLLCLK output from the delay locked loop 430 by one of different delay amounts according to whether the delay locked loop 430 performs the delay locking operation or not. Accordingly, although a frequency of the external system clocks CK and CKB increases, the invention can constantly adjust the data output timing in response to the read command RDCMD according to the CAS latency.

Figure 5A:
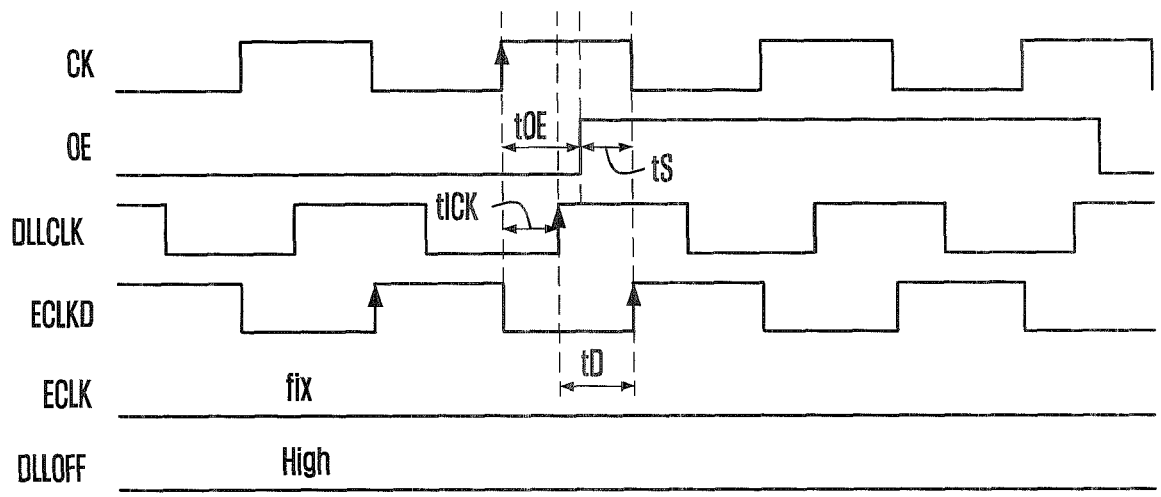
FIG. 5A is a signal timing diagram illustrating the operation of the semiconductor memory device of FIG. 4 in a low frequency environment when a delay locked loop is disabled.
Figure 5B:
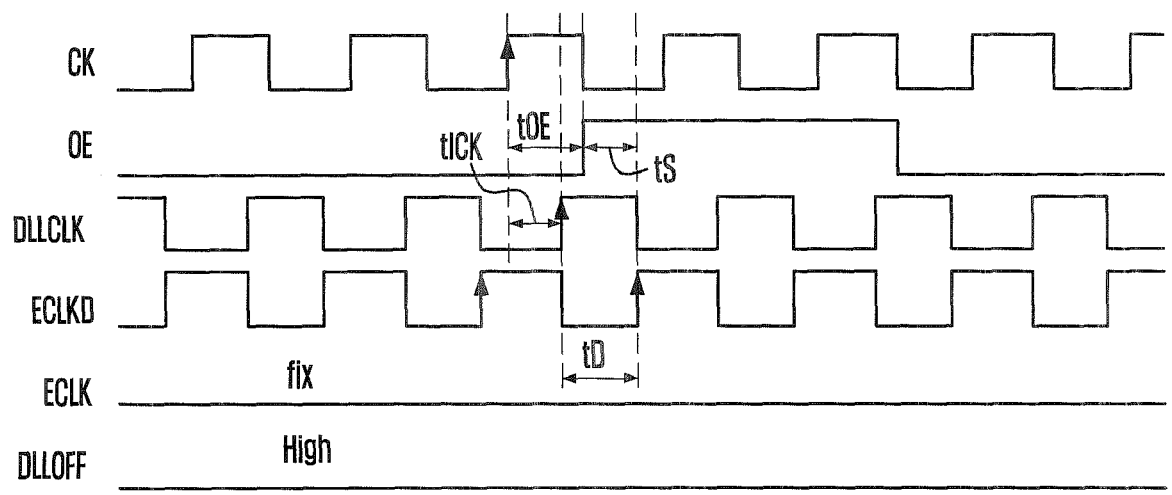
FIG. 5B is a signal timing diagram illustrating the operation of the semiconductor memory device of FIG. 4 in a high frequency environment when a delay locked loop is disabled.

FIG. 5A is a signal diagram illustrating the operation of the semiconductor memory device of FIG. 4 in a low frequency environment when the delay locked loop of FIG. 4 is disabled. FIG. 5B is a signal timing diagram illustrating the operation of the semiconductor memory device in a high frequency environment when the delay locked loop of FIG. 4 is disabled.

Referring to FIG. 5A, when the delay locked loop 430 does not perform the delay locking operation due to an activation of the DLL stop signal DLLOFF, the delay locked clock DLLCLK delayed by the internal delay time tICK is generated by transferring the system clock CK through internal paths of the clock buffer 420 and the delay locked loop 430. At this point, the operation controller 480 receives the delay locked clock DLLCLK and delays the delay locked clock DLLCLK by a third delay amount tD, and it outputs the buffered delay-locked clock ECLKD. That is, when the delay locked loop 430 does not perform the delay locking operation, the system clock CK is delayed by the internal delay time tICK and the third delay amount tD and then is transferred to the output timing determiner 490. Furthermore, the output signal generator 450 generates the output enable signal OE after an output signal generation time tOE elapses in response to the read command RDCMD input from the command decoder 410.

Therefore, when the semiconductor memory device operates with the system clock CK having a low frequency, the output timing determiner 490 can have an operation margin tS shown in FIG. 5A. For a stable operation of the semiconductor memory device, the third delay amount tD must be larger than tOE−tICK, where tOE is the output signal generation time and tICK is the internal delay time.

On the other hand, when the semiconductor memory device operates with the system clock CK having a high frequency, the system clock CK is delayed by the internal delay time tICK and the third delay amount tD and is transferred to the output timing determiner 490 in above-described way. Likewise, the output enable signal OE is generated after the output signal generation time tOE elapses. In order to secure the operation margin tS for a stable operation of the output timing determiner 490, the third delay amount tD must be less than 1tCK−tICK, where 1tCK is one period of the system clock and tICK is the internal delay time.

For the stable operation of the conventional semiconductor memory device, the output signal generation time tOE must be larger than tICK+tDLL−1tCK. As the frequency increases, one period 1tCK of the system clock CK gradually decreases, but the delay amount tDLL of the replica circuit of the output delay 470 does not decrease. Thus, it is difficult to satisfy conditions for the stable operation.

However, in case where the delay locked loop 430 does not perform the delay locking operation, if the output signal generation time tOE is greater than tICK+tD−1tCK, the invention can satisfy conditions for the stable operation. Herein, the third delay amount tD is greater than tOE−tICK and greatly less than the delay amount tDLL of the replica circuit of the output delay 470. Accordingly, although one period 1tCK of the system clock CK decreases compared to the prior art, the stable operation can be achieved. Therefore, the semiconductor memory device in accordance with the embodiment of the invention can be applied to more high frequency operation than the conventional semiconductor memory device.

Consequently, if the third delay amount tD is greater than tOE−tICK and less than 1tCK−tICK, the semiconductor memory device in accordance with the embodiment of the invention can perform the stable operation. Moreover, when the delay locked loop 430 does not perform the delay locking operation, the semiconductor memory device can prevent unnecessary current consumption by stopping the operation of the output delay 470.

Figure 6:
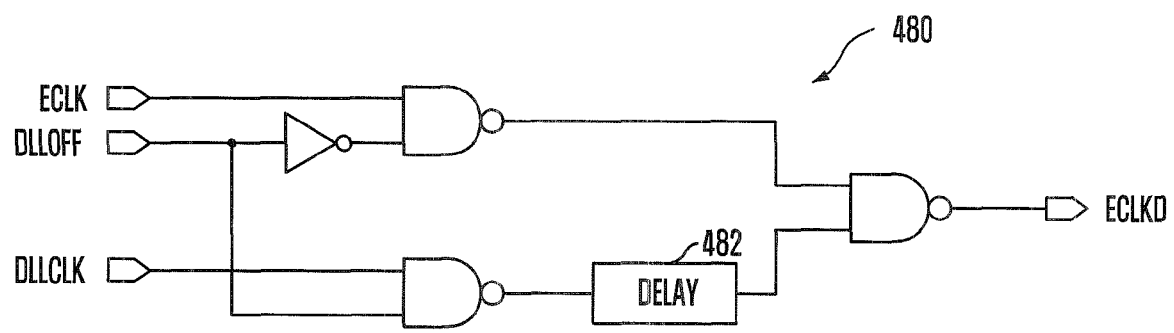
FIG. 6 is a block diagram of an operation controller of FIG. 4.

FIG. 6 is a block diagram of the operation controller 480 of FIG. 4.

Referring to FIG. 6, the operation controller 480 includes a plurality of logic gates and a delay 482. The logic gates transfer the delayed delay-locked clock ECLK output from the output delay 470 when the delay locked loop 430 is enabled, and transfer the delay locked clock DLLCLK when the delay locked loop 430 is disabled. The delay 482 delays the delay locked clock DLLCLK by the third delay amount tD when the delay locked loop 430 is disabled. A total delay amount of the delay 482 is the third delay amount tD and is greater than tOE−tICK and less than 1tCK−1ICK.

As described above, the invention can solve a disadvantage that the data output timing is not constantly maintained corresponding to the CAS latency as a frequency of the system clock increases when the delay locked loop does not perform the delay locking operation. Accordingly, the invention can extend a maximum frequency range of the system clock where the semiconductor memory device can perform a normal operation. Moreover, the invention can reduce unnecessary current consumption by stopping the operation of the output delay for determining the data output timing according to whether the delay locked loop performs the delay locked operation or not.

The invention can obtain the desired data output timing in spite of the change of the operation frequency by simply modifying the design of the data output control circuit. Accordingly, the invention can remove limitations of the high frequency operation by overcoming the limitation of the operating frequency of outputting the data even when the delay locked loop is disabled.

That is, the semiconductor memory device can exactly satisfy the data output timing according to the CAS latency, irrespective of whether the delay locked loop is enabled or disabled in spite of an environment using the system clock with a high frequency.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a delay locked loop configured to perform a delay locking operation on an internal clock to output a delay locked clock; and
   a data output control unit configured to control a delay amount of the delay locked clock to be different depending on whether the delay locked loop is enabled or disabled and determine a data output timing in response to a read command and the delay locked clock.

2. The semiconductor memory device as recited in claim 1, wherein the data output control unit includes:
   an output signal generator configured to output an output enable signal in response to the read command;
   an output delay configured to compensate the delay locked clock by a delay amount of a system clock delayed in a transfer path when the delay locked loop is enabled and to stop outputting of the compensated delay locked clock when the delay locked loop is disabled;
   an operation controller configured to transfer an output of the output delay when the delay locked loop is enabled and to transfer the delay locked clock when the delay locked loop is disabled; and
   an output timing determiner configured to output a data output control signal for determining the data output timing according to a column address strobe (CAS) latency, in response to the output enable signal and an output of the operation controller.

3. The semiconductor memory device as recited in claim 2, wherein the operation controller includes:
   a plurality of logic gates configured to transfer the output of the output delay when the delay locked loop is enabled and to transfer the delay locked clock when the delay locked loop is disabled; and
   a delay configured to delay the delay locked clock when the delay locked loop is disabled.

4. The semiconductor memory device as recited in claim 3, wherein a delay amount of the delay is greater than a time obtained by subtracting a second time from a first time, where the first time extends from a receipt of the read command to an activation of the output enable signal, and the second time extends until the system clock is output as the delay locked clock through the delay locked loop when the delay locked loop is disabled.

5. The semiconductor memory device as recited in claim 4, wherein the delay amount of the delay is less than a time obtained by subtracting the second time from one period of the system clock.

6. The semiconductor memory device as recited in claim 2, further including:
   a clock buffer configured to buffer the system clock to transfer the internal clock to the delay locked loop and the output signal generator; and
   a command decoder configured to decode an external command to recognize the decoded external command as the read command, and to notify the generation of the read command to the output signal generator.

7. A semiconductor memory device, comprising:
   an output signal generator configured to generate an output enable signal in response to a read command;
   a delay locked loop;
   an operation controller configured to control a delay amount reflected by a delay locked clock output from the delay locked loop differently according to whether the delay locked loop is enabled or disabled, and
   an output timing determiner configured to determine a data output timing according to a column address strobe (CAS) latency in response to the output enable signal and an output of the operation controller.

8. The semiconductor memory device as recited in claim 7, wherein the delay locked loop is enabled according to an operation mode of the semiconductor memory device and generates the delay locked clock used as a reference signal for an internal operation by compensating for a delay amount of a system clock delayed in an internal clock path.

9. The semiconductor memory device as recited in claim 8, wherein the semiconductor memory device further includes:
   a clock buffer configured to buffer the system clock to transfer an internal clock to the delay locked loop and the output signal generator;
   a command decoder configured to decode an external command to recognize the decoded external command as the read command, and to notify the generation of the read command to the output signal generator; and
   an output delay configured to delay the delay locked clock by a delay amount of the system clock delayed in transfer path and to transfer a delayed delay-locked clock to the operation controller.

10. The semiconductor memory device as recited in claim 9, wherein the operation controller includes:
    a plurality of logic gates configured to transfer an output of the output delay when the delay locked loop is enabled and to transfer the delay locked clock when the delay locked loop is disabled; and
    a delay configured to delay the delay locked clock when the delay locked loop is disabled.

11. The semiconductor memory device as recited in claim 10, wherein a delay amount of the delay is greater than a time obtained by subtracting a second time from a first time, where the first time extends from a receipt of the read command to an activation of the output enable signal, and the second time extends until the system clock is output as the delay locked clock through the delay locked loop when the delay locked loop is disabled.

12. The semiconductor memory device as recited in claim 11, wherein the delay amount of the delay is less than a time obtained by subtracting the second time from one period of the system clock.

13. A method for operating a semiconductor memory device, the method comprising:
    generating an output enable signal according to a read command;
    in a delay locked loop, performing a delay locking operation to generate a delay locked clock;

controlling a delay amount of the delay locked clock output from the delay locked loop to be different depending on whether the delay locking operation is enabled or disabled; and determining a data output timing according to a column address strobe (CAS) latency in response to the read command by using the output enable signal and the delay locked clock.

14. The method as recited in claim 13,
wherein the generation of the delay locked clock includes generation of the delay locked clock as a reference signal of an internal operation by performing the delay locking operation to compensate for a delay amount of a system clock delayed in an internal clock path according to an operation mode,
wherein the controlling of the delay amount includes:
   compensating the delay locked clock for the delay amount of the system clock when the delay locked operation is performed; and
   delaying the delay-locked clock by a first delay amount when the delay locked operation is not performed, and
wherein the determining of the data output timing includes:
   extracting the delay locked clock during an activation section of the output enable signal; and
   determining the data output timing by shifting a phase of the extracted delay locked clock according to the CAS latency.

15. The method as recited in claim 14, wherein the first delay amount is greater than a time obtained by subtracting a second time from a first time, where the first time extends from a receipt of the read command to an activation of the output enable signal, and the second time extends until the system clock is output as the delay locked clock through a delay locked loop when the delay locked operation is not performed.

16. The method as recited in claim 15, wherein the first delay amount is less than a time obtained by subtracting the second time from one period of the system clock.

17. The method as recited in claim 13, further comprising:
   buffering a system clock to generate an internal clock, and transferring the internal clock for the delay locking operation and the generation of the output enable signal; and
   decoding an external command to recognize the decoded external command as the read command, and notifying the generation of the read command.

* * * * *